United States Patent
Cope et al.

(10) Patent No.: US 10,218,312 B2
(45) Date of Patent: Feb. 26, 2019

(54) DYNAMIC VOLUME MANAGEMENT IN AUDIO AMPLIFIERS

(71) Applicant: QUALCOMM Incorporated, San Diego, CA (US)

(72) Inventors: William Cope, Maricopa, AZ (US); Jieting Sun, Chandler, AZ (US); Donald Gee, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/444,021

(22) Filed: Feb. 27, 2017

(65) Prior Publication Data

US 2017/0250655 A1 Aug. 31, 2017

Related U.S. Application Data

(60) Provisional application No. 62/301,564, filed on Feb. 29, 2016, provisional application No. 62/301,513, filed on Feb. 29, 2016.

(51) Int. Cl.
*H03F 3/217* (2006.01)
*H03F 1/02* (2006.01)
(Continued)

(52) U.S. Cl.
CPC ........... *H03F 1/0233* (2013.01); *H03F 1/523* (2013.01); *H03F 3/185* (2013.01); *H03F 3/2173* (2013.01);
(Continued)

(58) Field of Classification Search
CPC .......... H03F 3/185; H03F 3/2173; H03F 1/04; H03F 1/34; H03F 3/217; H03F 3/2171;
(Continued)

(56) References Cited

U.S. PATENT DOCUMENTS 5,633,940 A 5/1997 Wassink
5,982,160 A * 11/1999 Walters ................. H02M 3/156
323/222

(Continued)

FOREIGN PATENT DOCUMENTS

CN 1812256 A 8/2006
CN 202385058 U 8/2012
GB 2282016 A 3/1995

OTHER PUBLICATIONS

Dondon P., et al., "An Original Approach for the Design of a Class D Power Switching Amplifier—An Audio Application", IEEE, Electronics Circuits and Systems, vol. 1, Sep. 1999, pp. 161-164.

*Primary Examiner* — Khanh V Nguyen
(74) *Attorney, Agent, or Firm* — Patterson & Sheridan, L.L.P.

(57) ABSTRACT

Certain aspects of the present disclosure provide an amplifier for signal amplification. Certain aspects further describe methods and apparatus for applying overload protection for such amplifier. For example, one method generally includes detecting an overload condition of an amplifier based on a signal at a node of the amplifier, and controlling a parameter of an input signal of the amplifier such that the parameter of the input signal is maintained below a threshold based on the detection of the overload condition. The parameter of the input signal may include, for example, a voltage level or a duty cycle of the input signal.

25 Claims, 5 Drawing Sheets

(51) Int. Cl.
 H03F 3/185 (2006.01)
 H03F 1/52 (2006.01)
 H04R 3/00 (2006.01)
 H03G 7/00 (2006.01)
 H03G 7/08 (2006.01)

(52) U.S. Cl.
 CPC .............. H03G 7/002 (2013.01); H03G 7/08 (2013.01); H04R 3/007 (2013.01); *H03F 3/217* (2013.01); *H03F 3/2171* (2013.01); *H03F 2200/03* (2013.01); *H03F 2200/351* (2013.01); *H03F 2200/391* (2013.01); *H03F 2200/426* (2013.01); *H04R 2430/01* (2013.01)

(58) Field of Classification Search
 CPC ......... H03F 2200/351; H03F 2200/432; H03F 2200/78; H03F 1/0233; H03F 1/523; H03K 17/165; H03G 3/03
 USPC ............................ 330/10, 207 A, 207 P, 251
 See application file for complete search history.

(56) References Cited

U.S. PATENT DOCUMENTS

| | | | |
|---|---|---|---|
| 6,127,814 A * | 10/2000 | Goder | H02M 3/1588 323/282 |
| 6,294,954 B1 | 9/2001 | Melanson | |
| 6,373,334 B1 | 4/2002 | Melanson | |
| 6,552,606 B1 | 4/2003 | Veltman et al. | |
| 6,933,871 B2 | 8/2005 | Melanson et al. | |
| 7,265,617 B2 | 9/2007 | Ohkuri | |
| 7,276,963 B2 | 10/2007 | Wegner | |
| 7,312,654 B2 | 12/2007 | Roeckner et al. | |
| 7,362,254 B2 | 4/2008 | Kost | |
| 7,365,668 B2 | 4/2008 | Mitteregger | |
| 7,498,784 B2 * | 3/2009 | Gokita | G01R 19/003 323/282 |
| 7,538,607 B2 | 5/2009 | Morishima | |
| 7,554,390 B1 | 6/2009 | Shankar et al. | |
| 7,554,409 B1 * | 6/2009 | Zhang | H03F 1/523 330/10 |
| 7,570,118 B1 * | 8/2009 | Gaboriau | H03F 1/523 330/10 |
| 7,612,608 B2 | 11/2009 | Kozak et al. | |
| 7,671,774 B2 | 3/2010 | Braswell | |
| 7,705,673 B2 * | 4/2010 | Teng | H03F 1/523 330/207 P |
| 7,714,675 B2 | 5/2010 | Wang | |
| 7,773,358 B2 * | 8/2010 | Neesgaard | H03F 1/52 361/18 |
| 7,920,082 B2 | 4/2011 | Kawai et al. | |
| 8,054,130 B2 | 11/2011 | Rabary et al. | |
| 8,299,853 B2 | 10/2012 | Maejima | |
| 8,390,374 B2 | 3/2013 | Alexander et al. | |
| 8,884,795 B2 | 11/2014 | Takaike et al. | |
| 8,942,937 B2 | 1/2015 | Miyamoto et al. | |
| 9,077,295 B2 | 7/2015 | Ozaki | |
| 9,083,283 B2 | 7/2015 | Sugawara et al. | |
| 9,628,040 B2 | 4/2017 | Lesso et al. | |
| 9,680,496 B2 | 6/2017 | Kauffman et al. | |
| 9,985,594 B2 | 5/2018 | Quilligan et al. | |
| 2005/0135036 A1 * | 6/2005 | Kanamori | H02M 3/156 361/93.1 |
| 2012/0075132 A1 | 3/2012 | Lai et al. | |
| 2014/0240153 A1 | 8/2014 | Das | |
| 2015/0222190 A1 * | 8/2015 | Yim | H02M 3/33507 358/1.14 |
| 2015/0288335 A1 | 10/2015 | Høyerby | |
| 2017/0250654 A1 | 8/2017 | Cope | |
| 2017/0250662 A1 | 8/2017 | Cope et al. | |

\* cited by examiner

DYNAMIC VOLUME MANAGEMENT IN AUDIO AMPLIFIERS

CLAIM OF PRIORITY UNDER 35 U.S.C. § 119

The present application claims the benefit of U.S. Provisional Application Ser. No. 62/301,564, entitled "DYNAMIC VOLUME MANAGEMENT IN AUDIO AMPLIFIER" and filed Feb. 29, 2016, and U.S. Provisional Application Ser. No. 62/301,513, entitled "PERFORMANCE PROTECTION OF AUDIO POWER AMPLIFIER (PA) DURING HIGH MODULATION" and filed Feb. 29, 2016, both of which are assigned to the assignee of the present application and are expressly incorporated by reference herein in their entirety.

TECHNICAL FIELD

Certain aspects of the present disclosure generally relate to electronic circuits and, more particularly, to an audio amplifier.

BACKGROUND

Various electronic systems are capable of processing digital audio signals and amplifying the processed signals to drive a speaker, thereby producing sound waves. Examples of such systems include portable media player devices, cellular telephones, smartphones, tablets, computers, radios, audio recorders, stereo equipment (e.g., audio receivers), components in a vehicle, and the like. For digital audio processing, an encoder-decoder (CODEC) may be used to convert analog audio signals to encoded digital signals and vice versa. For example, a CODEC may receive an analog audio signal (e.g., from a microphone), and convert the analog audio signal into a digital signal that can be processed (e.g., digitally filtered) via a digital signal processor (DSP). The CODEC can then convert the processed digital output of the DSP to an analog signal for use by audio speakers, for example, via a digital-to-analog converter (DAC).

Amplification of digital or analog audio signals may be performed using any of various suitable techniques. Class-D amplifiers are widely used in audio applications because these types of amplifiers may be more efficient than class-AB amplifiers and involve less heat management and external components (e.g., heatsinks). A class-D amplifier generally refers to an electronic amplifier in which the transistors in the output stage operate as electronic switches, instead of as linear gain devices, as in other amplifier types. In a class-D amplifier, the signal to be amplified is a train of pulses of constant amplitude, but varying width and separation (e.g., different duty cycle), so the output stage transistors switch rapidly back and forth between fully conductive and nonconductive states. Before being applied to the amplifier, the signal to be amplified is converted to a pulse train using pulse width modulation, pulse density modulation, or other suitable techniques. The amplified pulse train output by the transistors can be converted back to an analog audio signal by low-pass filtering the pulse train to remove the unwanted high-frequency components introduced by pulse modulation and recover the desired low-frequency signal.

Despite their benefits, class-D amplifiers may have some drawbacks, such as lower linearity and/or lower power supply rejection ratio (PSRR) in certain aspects when compared to other amplifier implementations. In order to improve the overall performance of class-D amplifiers, feedback can be applied around the output power stage. This feedback may increase the linearity of the class-D output stage and may attenuate power supply ripple present in the audio band (for example, intermodulation products between the main signal and the power supply tones).

SUMMARY

Certain aspects of the present disclosure generally relate to audio amplifiers.

Certain aspects of the present disclosure provide a method for overload protection. The method generally includes detecting an overload condition of an amplifier based on a duty cycle of a signal at a node of the amplifier, and controlling an input signal of the amplifier based on the detection of the overload condition.

Certain aspects of the present disclosure provide a method for overload protection. The method generally includes detecting an overload condition of an amplifier based on a duty cycle of a signal at a node of the amplifier, and controlling a parameter of an input signal of the amplifier such that the parameter of the input signal is maintained at or below a threshold based on the detection of the overload condition.

Certain aspects of the present disclosure provide an apparatus for signal amplification. The apparatus generally includes an amplifier configured to amplify an input signal, and a circuit coupled to a node of the amplifier and configured to detect an overload condition of the amplifier based on a duty cycle of a signal at the node, and control the input signal based on the detection of the overload condition.

Certain aspects of the present disclosure provide an apparatus for signal amplification. The apparatus generally includes an amplifier configured to amplify an input signal, and a circuit coupled to a node of the amplifier and configured to detect an overload condition of the amplifier based on a signal at the node, and control a parameter of the input signal such that the parameter of the input signal is maintained at or below a threshold based on the detection of the overload condition.

Certain aspects of the present disclosure provide an apparatus for signal amplification. The apparatus generally includes means for generating an amplified signal based on an input signal, means for detecting an overload condition of the means for generating based on a duty cycle of a signal at a node of the means for generating, and means for controlling the input signal based on the detection of the overload condition.

Certain aspects of the present disclosure provide an apparatus for signal amplification. The apparatus generally includes means for generating an amplified signal based on an input signal, means for detecting an overload condition of the means for generating based on a signal at a node of the means for generating, and means for controlling a parameter of the input signal such that the parameter of the input signal is maintained at or below a threshold based on the detection of the overload condition.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure generally relate to applying overload protection for an amplifier. For example, a circuit may be used to monitor one or more signals to detect the overload condition, and enable overload protection functionality based on the detection. In certain aspects, the overload protection functionality may involve controlling a duty cycle of a signal at a node of the amplifier.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Class-D Amplifiers

Figure 1A:
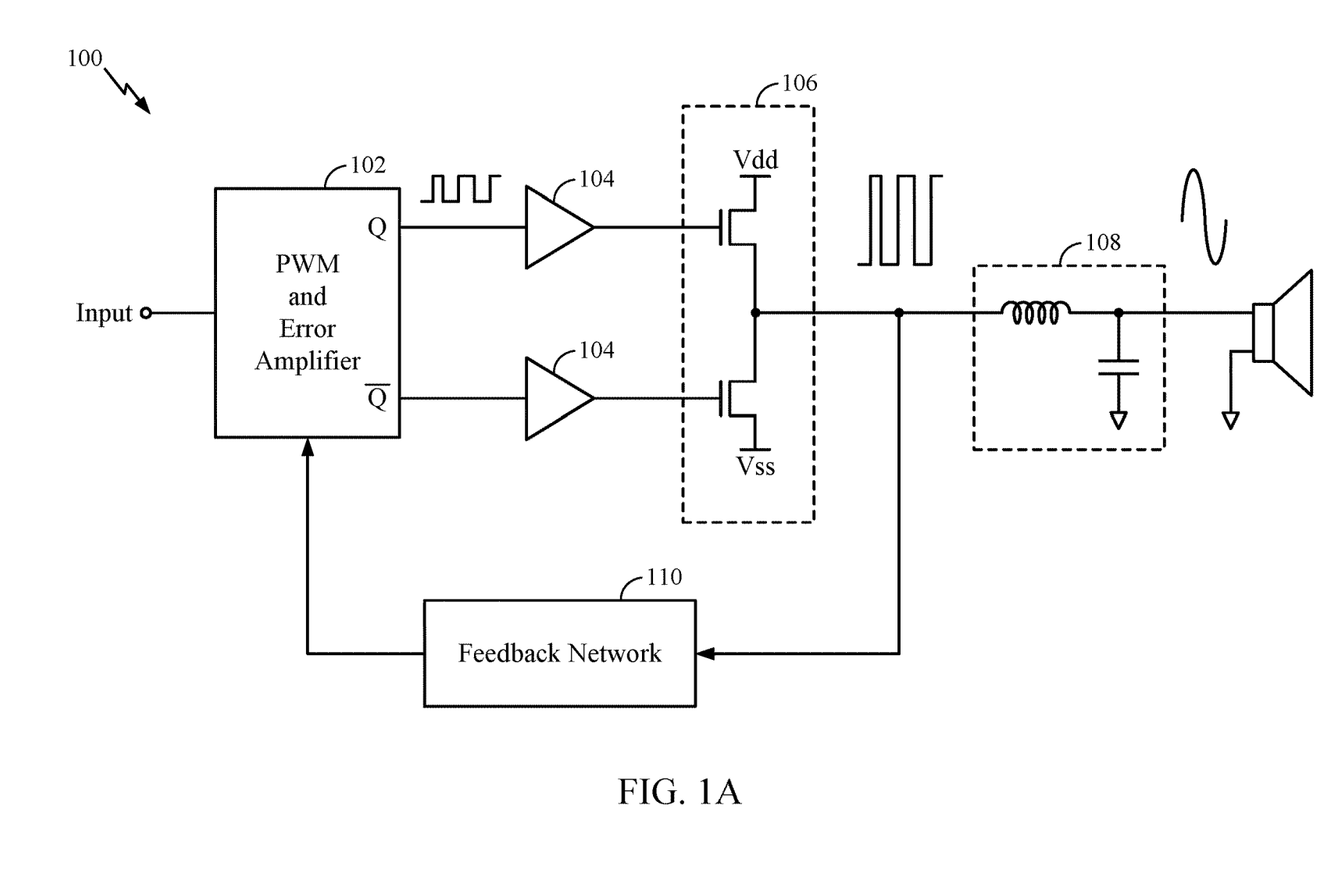
FIG. 1A is a block diagram of an example amplifier with feedback in a single-ended (SE) configuration, in accordance with certain aspects of the present disclosure.

FIG. 1A is a block diagram of an example amplifier 100 (e.g., class D) in a single-ended (SE) configuration (also known as a half-bridge topology), in accordance with certain aspects of the present disclosure. The amplifier 100 may include a pulse width modulator (PWM) and error amplifier 102, drivers 104, an output stage 106, a low-pass filter (LPF) 108, and a feedback network 110. The output of the amplifier 100 may be used to drive a speaker 112, as illustrated. The audio input signal to be amplified may be encoded into a train of square pulses of constant amplitude using pulse width modulation in the PWM and error amplifier 102. For certain aspects, the pulse train may be generated by comparing the input signal with a high frequency triangle waveform, where the triangle waveform defines both the input amplitude for full modulation and the switching frequency. The PWM and error amplifier 102 outputs the pulse train signal (on Q) and its inverse (on Q_bar) to the drivers 104.

The drivers 104 are configured to produce high current signals to charge and discharge the output stage capacitance (e.g., the gate capacitance if the output stage comprises field-effect transistors (FETs)) during the switching interval to ensure fast rise/fall times of the transistors. The drivers 104 may be implemented with any of various suitable topologies, such as using inverter/level shifters. The output stage 106 may include FETs, which may include, for example: (1) two n-channel metal-oxide semiconductor (NMOS) transistors or (2) one p-channel metal-oxide semiconductor (PMOS) transistor and one NMOS. In an SE configuration, the high-side transistor may be connected to a positive supply voltage (Vdd), and the low-side transistor may be connected to a negative supply voltage (Vss), as shown.

With the alternate switching of the transistors between the power supply voltages, as controlled by the drivers based on the pulse train signal (Q) and its inverse (Q_bar), the output signal from the output stage 106 is an amplified version of the pulse train. The LPF 108 filters the signal output by the output stage 106 to remove the high-frequency components introduced by the modulation and recover the desired audio signal. For certain aspects, the LPF 108 may be implemented with a series inductor and a shunt capacitor, as illustrated. The filtered audio signal output from the LPF 108 may be used to drive the speaker 112.

The introduction of dead time between deactivation of the high-side transistor and activation of the low-side transistor (or vice versa)—for example to prevent shoot-through current between the power supply rails if both transistors were on concurrently—may lead to nonlinear output impedance. Furthermore, the LPF 108 has a highly load-dependent frequency response in many implementations. These sources of errors may be mitigated in some implementations with negative feedback, which is implemented with the feedback network 110 connected between the output of the output stage 106 and an error amplifier in the PWM and error amplifier 102. The feedback network 110 may include a voltage divider and one or more integrators, for example, to effectively back out the effects of amplification and modulation and produce an error-inclusive signal that can be compared to the desired audio input signal.

Figure 1B:
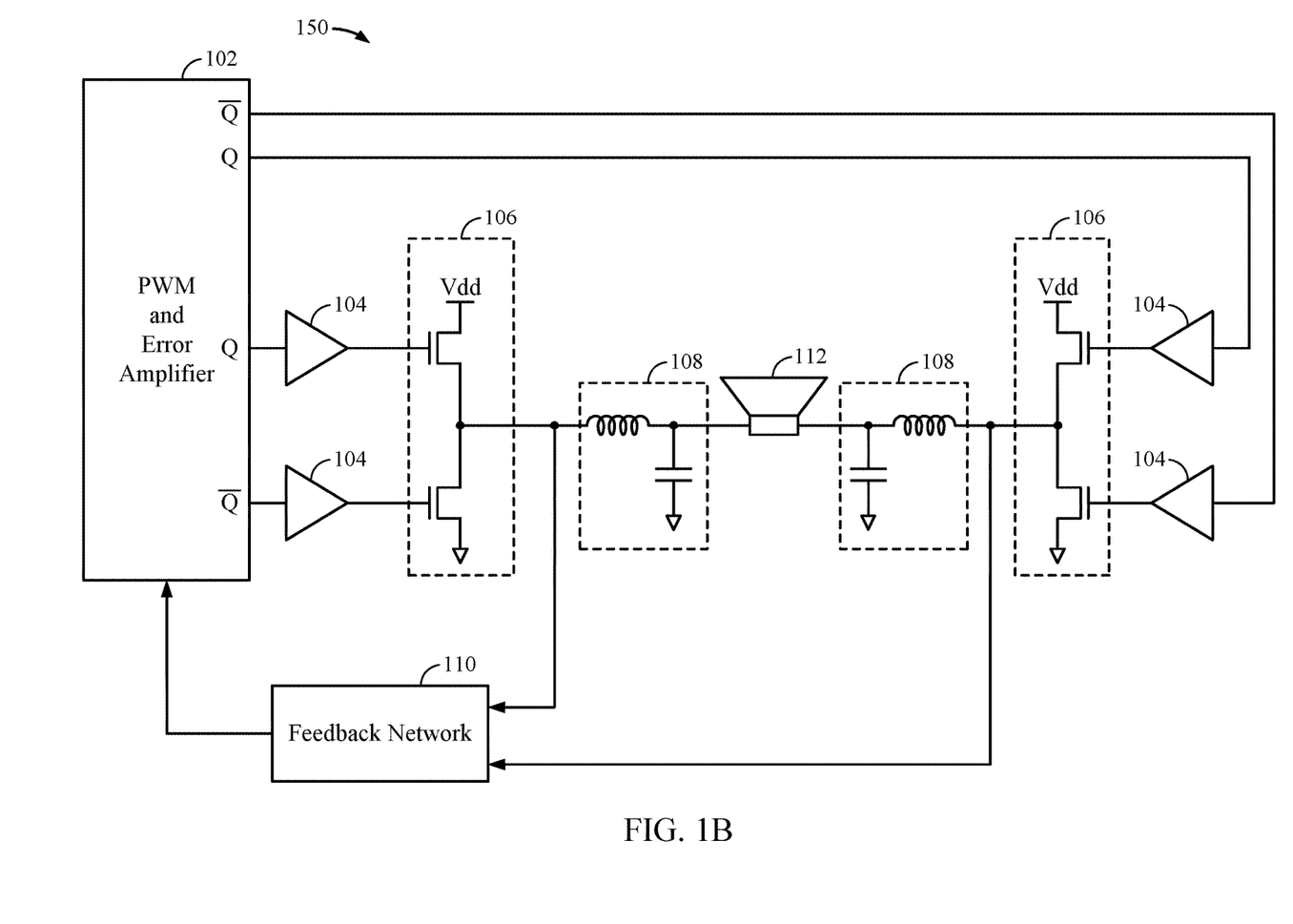
FIG. 1B is a block diagram of an example amplifier with feedback in a bridge-tied load (BTL) configuration, in accordance with certain aspects of the present disclosure.

FIG. 1B is a block diagram of an example amplifier 150 (e.g., class D) in a bridge-tied load (BTL) configuration (also known as a full-bridge topology), in accordance with certain aspects of the present disclosure. The BTL configuration includes two output stages 106 whose outputs are filtered by two LPFs 108, and the filtered signals differentially drive the speaker 112. The transistors of the two output stages 106 are driven by four drivers 104, which are controlled by four output pulse trains from the PWM and error amplifier 102, as shown. The feedback network 110 may also receive inputs from the outputs of both output stages 106.

Example Techniques for Dynamic Volume Management in Audio Amplifiers

Audio amplifiers perform under various power supply conditions. Some power supplies used to power audio amplifiers may not be able to handle high power draws. For example, as the power draw from the power supply increases, the voltage level of the power supply output may drop, in some cases, by up to fifty percent. Aspects of the present disclosure provide techniques and apparatus for detecting such an overload condition and enabling overload protection functionality based on the detection.

Figure 2:
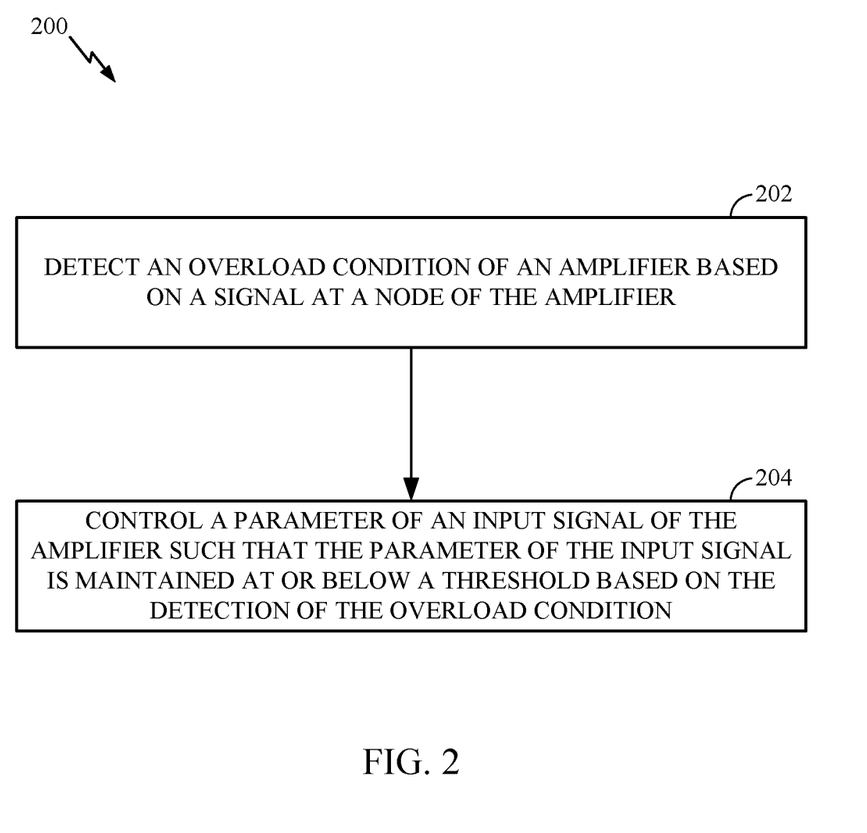
FIG. 2 is a flow diagram of example operations for applying overload protection for an amplifier, in accordance with certain aspects of the present disclosure.

FIG. 2 is a flow diagram of example operations 200 for overload protection, in accordance with certain aspects of the present disclosure. The operations 200 may be performed, for example, by an overload protection circuit as described in more detail herein.

The operations 200 may begin, at block 202, with detecting an overload condition of an amplifier (e.g., amplifier 100 or amplifier 150). In some aspects, the detecting may be based on a signal at a node of the amplifier. For example, the detection may be based on a voltage level or a duty cycle of the signal at the node. In some cases, the overload condition may be detected based on a rate of change of a power supply voltage used to power the amplifier (e.g., Vdd used to power the output stage 106). For example, if there is a sudden change in the voltage level of Vdd, this may indicate an overload condition where a constant (or reasonably constant) voltage level cannot be maintained for Vdd.

At block 204, the circuit may implement overload protection functionality based on the detected overload condition. For example, the circuit may control a parameter (e.g., voltage level or duty cycle) of an input signal of the amplifier such that the parameter of the input signal is maintained at or below a threshold based on the detection of the overload condition. For example, the circuit may prevent the voltage level or the duty cycle of the input signal from exceeding a certain threshold.

In certain aspects, the circuit may be configured to detect the overload condition if the duty cycle of the signal (e.g., a PWM signal) at the node of the amplifier reaches a threshold (e.g., 95% or even 100%). In some aspects, the node may be an input node of an output stage (e.g., a gate of a transistor in the output stage 106), an input node of one or more drivers (e.g., drivers 104) of the amplifier, or an output node of the output stage. In certain aspects, the input signal of the amplifier controlled at block 204 may include the input signal to the PWM and error amplifier (e.g., PWM and error amplifier 102), the input signals to the drivers, or the input signals to the output stage.

In certain aspects, the detection of the overload condition may be based on one or more other signals such as the input signal to the PWM and error amplifier 102 and/or a feedback signal (e.g., the feedback signal output from the feedback network 110). For example, to detect the overload condition, a circuit may be used to monitor and track the input signal to the PWM and error amplifier 102 and/or the feedback signal and compare the input signal and/or feedback signal to a threshold.

In certain aspects, the detected overload condition may be monitored and tracked (e.g., via a counter) before the overload protection functionality is triggered. For example, a circuit may be used to adjust (e.g., increment) a value of a counter based on the detection, and the overload protection functionality may be triggered once the value of the counter reaches a certain limit. For example, the counter may be used to trigger the overload protection functionality after the duty cycle at the node of the amplifier has hit a threshold (e.g., 100%) for a number of times. For example, for each period of the PWM signal, if the duty cycle at the node exceeds a threshold (e.g., 95%), the counter may be incremented. However, if the duty cycle at the node does not exceed the threshold, the counter may be decremented. When the counter reaches a certain limit (e.g., a count of 10), overload protection functionality may be triggered.

In some cases, the counter may be adjusted (e.g., incremented) based on the absolute value of the input signal to the PWM and error amplifier 102 and/or the feedback signal. For example, if the absolute value of the input signal to the PWM and error amplifier 102 and/or the feedback signal exceeds a threshold, the counter may be incremented. However, if the input signal to the PWM and error amplifier 102 and/or the feedback signal do not exceed the threshold, the counter may be decremented. In certain aspects, the counter may be updated after one or more periods of the PWM signal generated by the PWM and error amplifier 102. For example, after each period of the PWM signal, the overload protection circuit 402 may compare the absolute value of the input signal and/or feedback signal to a threshold, and update (e.g., increment or decrement) the counter accordingly.

In some cases, the detection of the overload condition at block 202 may be based on a combination of signals at different nodes of the amplifier. That is, the overload condition may be detected based on any combination of at least one of the signal at the node of the amplifier, the input signal to the PWM and error amplifier 102, the feedback signal, or a rate of a change of the power supply voltage Vdd. For example, the overload condition may be detected (e.g., triggering overprotection functionality) if a duty cycle at the node of the amplifier exceeds a threshold and the rate of change of the power supply voltage Vdd exceeds another threshold. As used herein, the term "threshold" generally refers to any particular level or point of a parameter. For example, a threshold may refer to a voltage level threshold, a duty cycle threshold, a rate of change threshold, or a threshold (e.g., a limit) of a counter used to count a number of times a certain condition has occurred.

Figure 3:
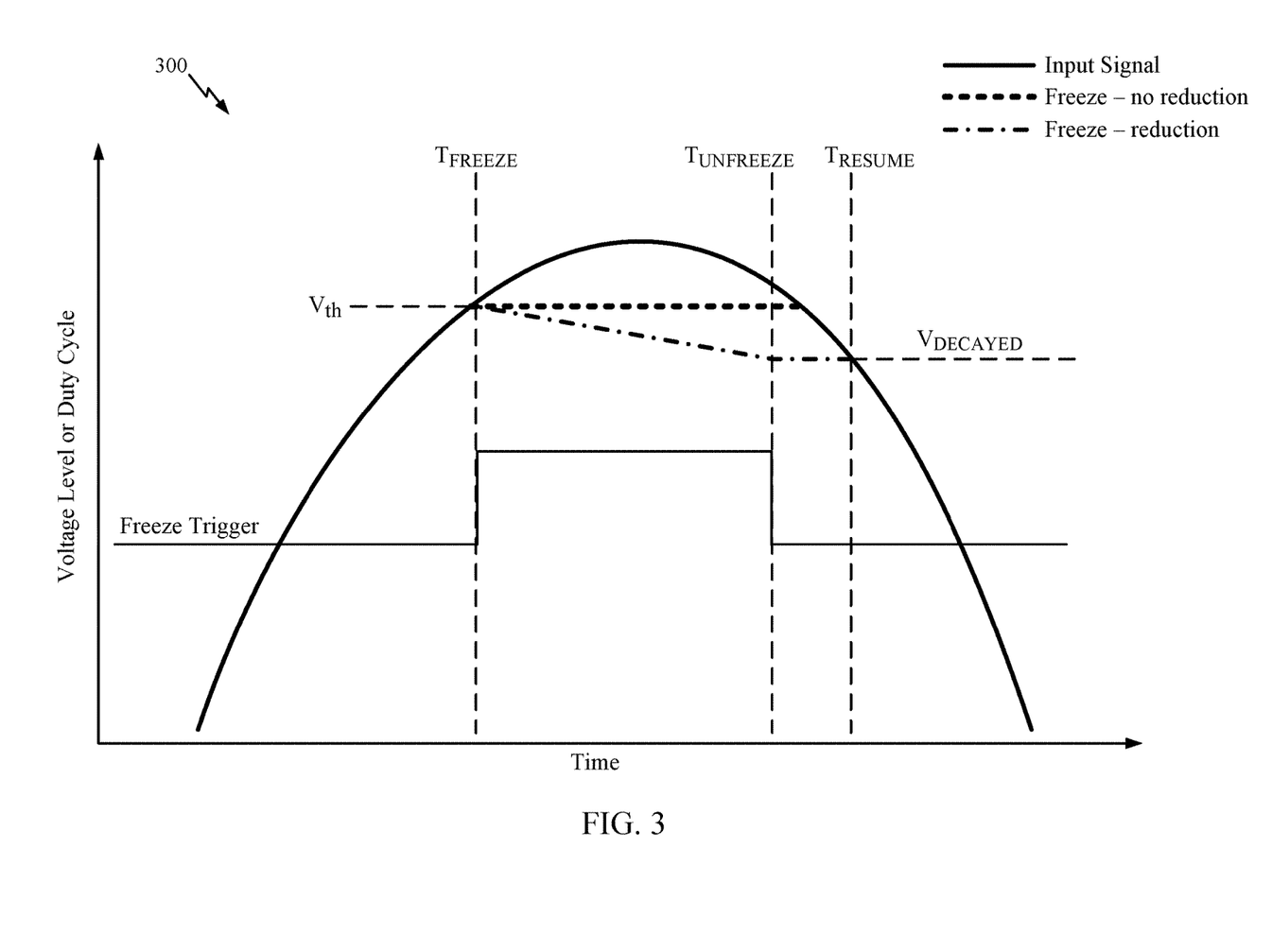
FIG. 3 is a graph illustrating a freeze function of an amplifier, in accordance with certain aspects of the present disclosure.

FIG. 3 is an example graph 300 illustrating an example overload protection functionality (e.g., freeze event), in accordance with certain aspects of the present disclosure. As illustrated, a freeze trigger signal may be used to initiate a freeze event. The freeze trigger signal may be a signal generated by an overload protection circuit and used to attenuate the input signal of the amplifier (e.g., amplifier 100 or 150). In certain aspects, the input signal curve of graph 300 may represent a voltage level of the signal input to the PWM and error amplifier 102. In certain aspects, the input signal curve represents a PWM signal (which has a particular duty cycle) used to drive the output stage 106, after being low-pass filtered. For example, the peak of the input signal curve of graph 300 may represent a 100% duty cycle.

Figure 4:
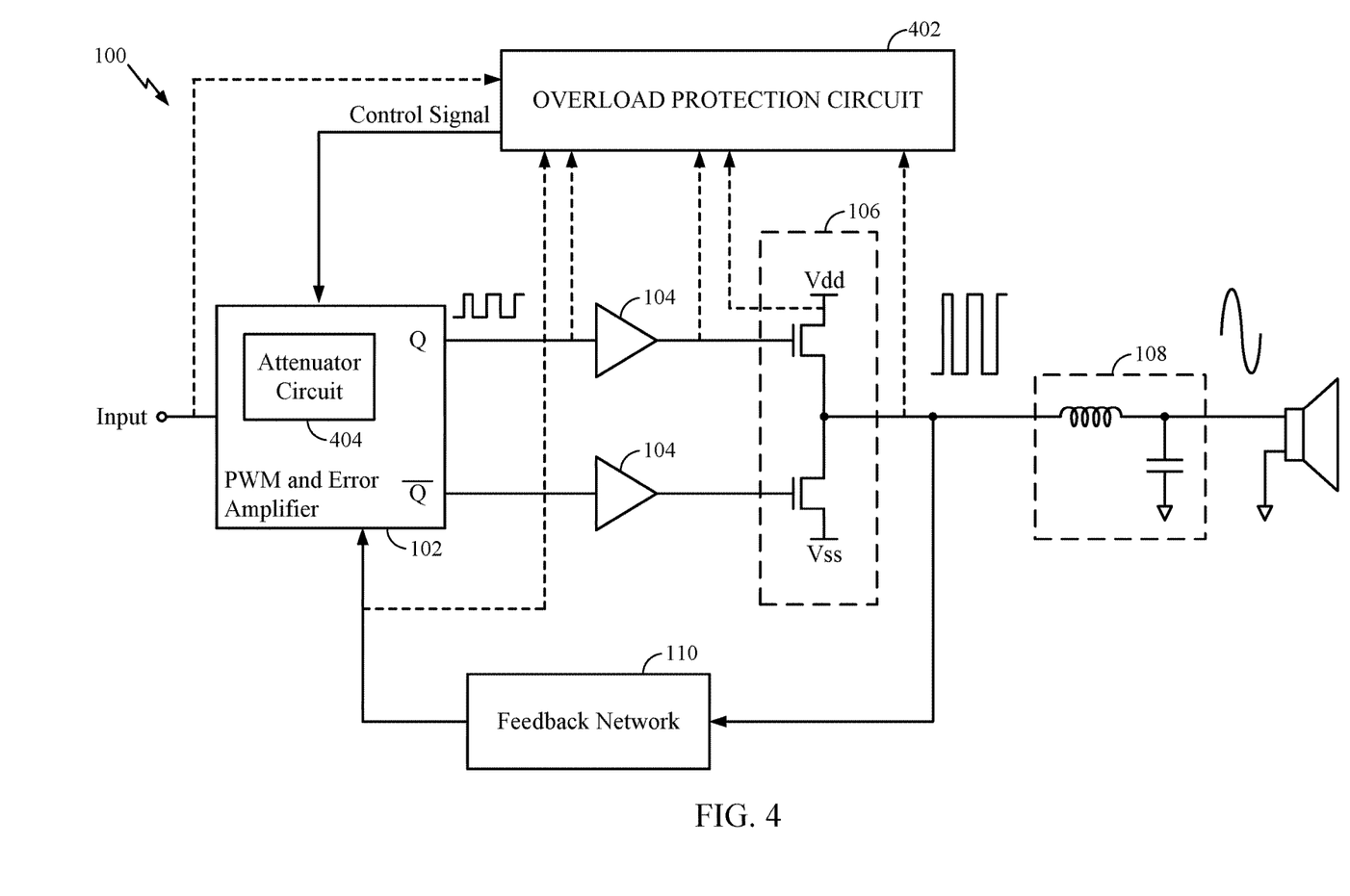
FIG. 4 is a block diagram of an example amplifier implemented with overload protection circuitry, in accordance with certain aspects of the present disclosure.

FIG. 4 is a block diagram of the example amplifier 100 with an overload protection circuit 402, in accordance with certain aspects of the present disclosure. The freeze trigger signal may be provided by the overload protection circuit 402 to the PWM and error amplifier 102 as part of the control signal, as illustrated. Based on the freeze trigger signal, the PWM and error amplifier 102 may attenuate the input signal via an attenuator circuit 404. The PWM and error amplifier 102 may then generate the PWM signal used to drive the output stage 106 based on the attenuated input signal.

The freeze trigger signal may be controlled by the overprotection circuit 402 based on a determination of an overload condition as described herein. For example, the overprotection circuit 402 may assert the freeze trigger signal when an overload condition is detected, and stop asserting the trigger signal when the overload condition has ended. When the freeze trigger signal is asserted (e.g., switches from logic low to logic high), the input signal of the amplifier may be attenuated (e.g., by the attenuator circuit 404) in an effort to limit the duty cycle of the PWM signal used to drive the output stage 106. For example, the input signal may be attenuated such that the input signal does not exceed a voltage threshold Vth, as illustrated by the "freeze-no reduction" line of graph 300.

In some cases, the input signal may be decayed during the freeze period (e.g., while the freeze trigger is asserted) at a specific rate, as illustrated by the "freeze-reduction" trace of graph 300. For example, the freeze rate may be increased by decaying the input signal to keep the system stable. For example, the input signal may be decayed if the power supply voltage (e.g., Vdd of FIG. 1A) of the amplifier drops rapidly in value. In this case, the control signal provided to the PWM and error amplifier 102 may indicate to the PWM and error amplifier 102 to begin decaying the input signal to stabilize the system.

To properly reduce the input signal, a scaled reduction of the input signal may be implemented. For example, in a case where the input signal to the PWM and error amplifier 102 is being attenuated via the attenuator circuit 404, the attenuator circuit 404 may decay the voltage level of the input signal as illustrated in graph 300. In a case where the duty cycle of a PWM signal used to drive the output stage 106 is being reduced, the PWM and error amplifier 102 may decay the duty cycle of the PWM signal (e.g., starting from 80% down to 75%) based on the control signal. For example, as illustrated, the input signal may be decayed starting at time $T_{FREEZE}$ until time $T_{UNFREEZE}$. As illustrated in FIG. 3, the input signal may be attenuated even after the freeze trigger signal is no longer asserted until the input signal falls below the freeze voltage threshold Vth or $V_{DECAYED}$. For example, the PWM and error amplifier 102 may be configured to continue attenuating the input signal even after the freeze trigger signal received from the overprotection circuit 402 goes low in an attempt to prevent the input signal from increasing and reinstating the overload condition. This attenuation may be performed by the PWM and error amplifier 102 until the PWM and error amplifier 102 determines the input signal has gone below $V_{DECAYED}$, for example, and/or until another signal is received from the overload protection circuit 402 indicating to the PWM and error amplifier 102 to stop attenuating the input signal, for example.

In some cases, instead of or in addition to the freeze described above, another response may be used. In some implementations, this other response provides a longer-term benefit, while the freeze response described above may be used to protect against short-term events. The other response involves decreasing the voltage (or duty cycle) of the input signal at a periodic rate (e.g., every N microseconds) until the overload condition is no longer detected (e.g., as opposed to a steady decrease of the voltage (or duty cycle) described with respect to FIG. 3). For example, at each periodic interval, a control signal may be provided by the overload protection circuit 402 to the PWM and error amplifier 102. The control signal at each periodic interval may increase the amount of attenuation of the input signal (or reduce the duty cycle of the PWM signal used to drive the output stage 106) until the overload condition is no longer detected.

When the overload condition is no longer detected, the input signal may be returned to normal operation (e.g., no longer frozen or limited to a voltage). In some cases, the input signal may be returned to normal in equivalent steps as the reduction (e.g., every N microseconds), or at a different rate (e.g., a release rate).

As illustrated in FIG. 4, the overload protection circuit 402 may receive at least one of a plurality of signals at different nodes of the amplifier 100 as illustrated by the dotted lines to the overload protection circuit 402. For example, the overload protection circuit 402 may receive a signal from at least one of: (1) the input node to the PWM and error amplifier 102, (2) the input node of at least one of the drivers 104, (3) an input node of the output stage 106, (4) the power supply node Vdd, or (5) the output node of the output stage 106.

Based on one or more signals received by the overload protection circuit 402, the overload protection circuit 402 may detect an overload condition and attenuate (e.g., via the control signal provided to the attenuator circuit 404) the input signal used to generate the PWM signal for driving the output stage 106. While certain examples provided herein are described with respect to the amplifier 100 having a SE configuration to facilitate understanding, aspects of the present disclosure may be implemented with the amplifier 150 that is in a bridge-tied load (BTL) configuration.

Further, as described above with respect to certain aspects herein, an input signal may continue to be applied and the amplifier may continue to operate during a time when an overload condition is detected. In certain implementations, maintaining the input signal in this way may reduce distortion created or detected by a listener of an audio signal output by the amplifier, for example, as compared to other circuits which may cease operation or cease application of (or reduce to zero) the input signal.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for overload protection, comprising:
   detecting an overload condition of an amplifier based on a signal at a node of the amplifier; and
   controlling a parameter of an input signal of the amplifier such that the parameter of the input signal is maintained at or below a first threshold until the overload condition is no longer detected, wherein controlling the parameter comprises decreasing the parameter of the input signal while the amplifier is in the overload condition, wherein the parameter of the input signal comprises a voltage level of the input signal or a duty cycle of the input signal.

2. The method of claim 1, wherein the signal at the node comprises the input signal, and wherein the parameter of the input signal comprises a duty cycle of the input signal.

3. The method of claim 1, wherein the node comprises an input node of an output stage of the amplifier, an input node of one or more drivers configured to drive the input node of the output stage, or an output node of the output stage of the amplifier.

4. The method of claim 1, wherein the signal at the node comprises a pulse-width modulation (PWM) signal, and wherein the overload condition of the amplifier is detected based on a duty cycle of the PWM signal.

5. The method of claim 1, wherein detecting the overload condition is further based on at least one of the input signal or a feedback signal of the amplifier.

6. The method of claim 1, further comprising:
   adjusting a value of a counter based on the detection; and
   comparing the value of the counter to a second threshold, wherein controlling the input signal is performed in response to the value of the counter exceeding the second threshold.

7. The method of claim 6, wherein detecting the overload condition comprises comparing a duty cycle of the signal at the node with a third threshold.

8. The method of claim 7, wherein adjusting the value of the counter comprises:
   incrementing the counter if the duty cycle exceeds the third threshold; and
   decrementing the counter if the duty cycle does not exceed the third threshold.

9. The method of claim 7, wherein controlling the parameter of the input signal comprises decreasing a voltage of the input signal until the value of the counter no longer exceeds the second threshold.

10. The method of claim 9, wherein controlling the parameter of the input signal further comprises increasing the voltage of the input signal if the value of the counter no longer exceeds the second threshold.

11. The method of claim 1, wherein the signal at the node of the amplifier comprises a power supply voltage of the amplifier, and wherein detecting the overload condition is based on a rate of change of the power supply voltage.

12. The method of claim 1, wherein decreasing the voltage level of the input signal comprises decreasing the parameter of the input signal periodically.

13. An apparatus for signal amplification, comprising:
    an amplifier configured to generate an amplified signal based on an input signal; and
    a circuit coupled to a node of the amplifier and configured to:
       detect an overload condition of the amplifier based on a signal at the node; and
       control a parameter of the input signal of the amplifier such that the parameter of the input signal is maintained at or below a first threshold until the overload condition is no longer detected, wherein controlling the parameter comprises decreasing the parameter of the input signal while the amplifier is in the overload condition, wherein the parameter of the input signal comprises a voltage level of the input signal or a duty cycle of the input signal.

14. The apparatus of claim 13, wherein the signal at the node comprises the input signal, and wherein the parameter of the input signal comprises a duty cycle of the input signal.

15. The apparatus of claim 13, wherein the node comprises an input node of an output stage of the amplifier, an input node of one or more drivers configured to drive the input node of the output stage, or an output node of the output stage of the amplifier.

16. The apparatus of claim 13, wherein the signal at the node comprises a pulse-width modulation (PWM) signal, and wherein the circuit is configured to detect the overload condition of the amplifier based on a duty cycle of the PWM signal.

17. The apparatus of claim 13, wherein the circuit is further configured to detect the overload condition based on at least one of the input signal or a feedback signal of the amplifier.

18. The apparatus of claim 13, wherein the circuit is further configured to:
adjust a value of a counter based on the detection; and
compare the value of the counter to a second threshold, wherein the circuit is configured to control the parameter of the input signal in response to the value of the counter exceeding the second threshold.

19. The apparatus of claim 18, wherein the circuit is further configured to detect the overload condition by comparing a duty cycle of the input signal with a third threshold.

20. The apparatus of claim 19, wherein the circuit is configured to adjust the value of the counter by:
incrementing the counter if the duty cycle exceeds the third threshold; and
decrementing the counter if the duty cycle does not exceed the third threshold.

21. The apparatus of claim 19, wherein the circuit is configured to control the parameter of the input signal by increasing the parameter of the input signal if the value of the counter no longer exceeds the second threshold.

22. The apparatus of claim 13, further comprising:
a power supply, wherein the signal at the node comprises a power supply voltage generated by the power supply to power an output stage of the amplifier, wherein the circuit is configured to detect the overload condition based on a rate of change of the power supply voltage.

23. The apparatus of claim 13, wherein the circuit is configured to decrease the parameter of the input signal periodically.

24. An apparatus for signal amplification, comprising:
means for generating an amplified signal based on an input signal;
means for detecting an overload condition of the means for generating based on a signal at a node of the means for generating; and
means for controlling a parameter of the input signal such that the parameter of the input signal is maintained at or below a threshold based on the detection of the overload condition until the overload condition is no longer detected, wherein the means for controlling comprises means for decreasing the parameter of the input signal while the means for generating is in the overload condition, wherein the parameter of the input signal comprises a voltage level of the input signal or a duty cycle of the input signal.

25. The apparatus of claim 24, wherein the signal at the node comprises the input signal.

* * * * *